United States Patent [19]

Kaszas et al.

[11] Patent Number: 5,171,760
[45] Date of Patent: Dec. 15, 1992

[54] UV CURABLE POLYMER FORMULATION

[75] Inventors: Gabor Kaszas; Judit E. Puskas; Joseph P. Kennedy, all of Akron, Ohio

[73] Assignee: Edison Polymer Innovation Corp., Broadview Heights, Ohio

[21] Appl. No.: 632,368

[22] Filed: Dec. 21, 1990

Related U.S. Application Data

[63] Continuation of Ser. No. 228,493, Aug. 5, 1988, abandoned.

[51] Int. Cl.$^5$ .................. C08F 2/48; C08F 293/00; C08F 236/06
[52] U.S. Cl. .................................. 522/121; 525/314
[58] Field of Search ..................... 522/121; 525/314

[56] References Cited

U.S. PATENT DOCUMENTS

| | | | |
|---|---|---|---|
| 4,152,231 | 5/1979 | St. Clair et al. | 204/159.17 |
| 4,327,201 | 4/1982 | Kennedy et al. | 526/131 |
| 4,910,261 | 3/1990 | Kaszas et al. | 525/314 |
| 4,980,269 | 12/1990 | Sakurai et al. | 522/121 |

Primary Examiner—Marion E. McCamish
Assistant Examiner—Susan Berman
Attorney, Agent, or Firm—Oldham, Oldham & Wilson Co.

[57] ABSTRACT

A cross-linked composition produced by exposing a mixture including a telechelic polyisobutylene-containing base polymer which carries multiple terminal acrylate groups as a part thereof, a reactive diluent, and in some cases, a high-energy sensitizer, to high-energy radiation. The base polymer may also comprise a block copolymer which has polyisobutylene, and polydiene blocks as, for example, polyisoprene, and in which the polydiene blocks, advantageously partially cyclized, carry multiple acrylate groups as a part thereof. Among other things, the compositions have particular application in the formation of films useful in the electronic, biomedical, specialty adhesive, sealant, and other fields.

8 Claims, No Drawings

UV CURABLE POLYMER FORMULATION

This is a continuation of copending application Ser. No. 07/228,493, filed on Aug. 5, 1988, now abandoned.

TECHNICAL FIELD

This invention relates to curable compositions from which coatings and other useful articles can be prepared. More particularly, this invention relates to compositions that are curable by high-energy radiation, which are flexible, and which have the ability to adhere tenaciously to substrate surfaces on which they are placed. Specifically, this invention relates to mixtures of linear and tri-arm, telechelic polyisobutylene-containing base polymers which are capped by acrylate groups, or substituted acrylate groups, in combination with certain reactive diluents comprising multifunctional acrylate, or substituted acrylate esters; and to base polymers comprised of block copolymers which include polyisobutylene blocks and polydiene blocks, subsequently modified to carry multiple acrylate groups or substituted acrylate groups, in combination with such diluents; that can be crosslinked by high-energy radiation.

BACKGROUND OF THE INVENTION

There has long been an industrial need for flexible polymers which exhibit good chemical, thermal, and moisture resistance, and which in film-form are relatively impermeable by gases. While various polymers have been developed which display one or more such characteristics, few have been discovered which display most, or all of them. In addition, some of the polymers which do have characteristics which include at least some of those described, are undesirably brittle and unsuited for applications where the material is to be subjected to mechanical stress, or where good substrate adhesion is required. In the electronics industry, for example, the advent of microprocessors, and microcircuitry in general, has created a need for protective films which adhere strongly to the substrates on which they are placed, which are flexible enough to withstand mechanical stresses, which are thermally stable, and which are impermeable to moisture and reactive materials present in the ambient atmosphere to which they are exposed. Further, in the medical field, particularly in connection with devices such as pacemaker wire coatings, there is a need for chemically inert, strongly adherent materials that can be used with such devices as a protective coating. In addition, there are numerous other specialty adhesive and sealant applications which would benefit from polymer compositions having the desirable characteristics described.

In the recent past, considerable interest has been shown in high-energy curable coatings such as polyesters and polyethers capped with acrylate and methacrylate functions, in combination with various low molecular weight acrylate or methacrylate esters. Unfortunately, however, the cross-linked compositions obtainable from such materials reflect the properties of their base polymers, and the latter are commonly deficient in one or more respects relative to the properties sought, as previously described, particularly with respect to flexibility. Attempts have been made to incorporate various polar rubbers such as the fluorocarbons and nitrile rubbers; however, such attempts have not been completely successful. Nonpolar rubbers such as polyisobutylene have not hitherto been used in ultraviolet curable formulations, possibly due to their chemical inertness, a characteristic which interferes with their incorporation into an acrylate network. In addition, even when acrylate or methacrylate capped polyisobutylenes are cross-linked by themselves with UV radiation, they exhibit unacceptable levels of extractable fractions, possibly due to the reduced mobility of the capped polyisobutylenes as the cross-linking reaction proceeds. This apparently limits their ability to enter into the cross-linking reaction and makes them vulnerable to extraction.

DISCLOSURE OF THE INVENTION

In light of the preceding, therefore, it is a first aspect of this invention to provide a polymeric composition cross-linkable by high-energy radiation.

A second aspect of this invention is to provide polyisobutylene acrylates, the term "acrylate", or "acrylates" as used herein meaning, as the case may be, an acrylate group itself, or a substituted acrylate such as, for example, methacrylate; mixed in combination with a reactive diluent comprising a multi-functional acrylate ester in which the components have been cross-linked by exposure to high-energy radiation such as ultraviolet, UV, light or electron beam, E.B., radiation.

Another aspect of this invention is to furnish a flexible, cross-linked polymeric composition which exhibits extremely low water absorption, and substantial impermeability to moisture and ambient gases in contact with the composition.

A further aspect of this invention is to provide polymeric films which adhere tenaciously to substrates on which they are coated.

An additional aspect of this invention is to provide a UV cross-linked polymer useful for protecting electronic components, also useful as an adhesive or sealant, and which has biomedical applications.

Yet another aspect of this invention is to provide UV-curable, substantially solventless, transparent, flexible polymeric compositions which are relatively chemically inert.

The foregoing and other aspects of this invention are provided by a cross-linked polymeric composition produced by cross-linking a mixture including reactive components, which comprises a telechelic polyisobutylene-containing base polymer which carries multiple terminal acrylate groups as a part thereof, or a polyisobutylene-containing base polymer comprising a block copolymer which includes polyisobutylene and polydiene blocks and which carries multiple acrylate groups as a part thereof; together with a reactive diluent, through exposure of said mixture to high-energy radiation.

The foregoing and yet other aspects of the invention are also furnished by the process of preparing a cross-linked polymer by exposing to high-energy radiation a mixture including reactive components comprising a telechelic polyisobutylene-containing base polymer which carries multiple terminal acrylate groups as a part thereof, or a polyisobutylene-containing base polymer comprising a block copolymer which includes polyisobutylene and polydiene blocks and which carries multiple acrylate groups as part thereof; and a multi-functional reactive diluent.

DETAILED DESCRIPTION OF THE INVENTION

The polymers of the invention can be cured with high-energy radiation, especially UV, or electron-beam radiation, to form essentially complete networks. The swelling ratios obtained by immersion of the materials in solvents is small, indicating cross-linked gels. Films of the materials cast on surfaces of glass, Teflon, stainless steel and aluminum, cured with UV radiation, for example, are essentially transparent and adhere tenaciously to the surfaces. Films of such materials contain no pinholes, and exhibit low and high temperature transitions indicative of a domain-separated morphology of soft polyisobutylene segments, in combination with hard acrylate segments. Water absorption of coatings made from the materials, which are highly hydrophobic, is negligible.

Polymers of the invention are composed of a base polymer which has been cross-linked with reactive diluents. Cross-linking is accomplished by exposing such mixtures to high-energy radiation, in the case of UV radiation in the presence of suitable UV photosensitizers.

Suitable base polymers include linear and tri-arm-telechelic polyisobutylenes, the ends of which had been capped with acrylate, or substituted acrylate groups. The preparation of dihydroxyl and trihydroxyl telechelic polyisobutylenes has previously been described, respectively, in the *Journal of Polymer Science*, Polymer Chemistry Edition, Vol. 18, page 3177 et seq. (1980), and in the *Journal of Applied Polymer Science*, Vol. 33, pages 2449 et seq. (1987). The corresponding acrylate esters can be prepared with acryloyl chloride or methacryloyl chloride, employing techniques well known in the art.

Other suitable base polymers, however, include telechelic polyisobutylene polymers which have been reacted with various diene monomers to produce block copolymers comprising polyisobutylene segments, and polydiene segments. Such copolymers, and methods for preparing them, are described in patent application Ser. No. 208,374 now U.S. Pat. No. 4,910,261, entitled "Improved Thermoplastic Elastomers", whose inventors are Gabor Kaszas, Judit E. Puskas and Joseph P. Kennedy. Such copolymers are subsequently sequentially subjected to hydroboration, oxidation, and then esterification, again with acryloyl chloride or methacryloyl chloride, also in ways well known to the art, to produce copolymers having acrylate groups attached to the polydiene blocks of the copolymers.

While any of the preceding base polymers are suitable for preparing the cross-linked polymers of the invention, the use of base polymers which include polyisobutylenes which have been reacted with diene monomers to produce block copolymers, as described, especially those in which the polydiene blocks are at least partially cyclized, is particularly useful for purposes of the invention since the unsaturation provided by the polydiene portion of the copolymers provides more sites for attaching acrylate functions than is provided by the acrylate terminated telechelic polyisobutylene homopolymers. Such polyfunctional acrylate block copolymers are capable of producing particularly highly cross-linked networks, and the use of such copolymers is, therefore, an especially preferred embodiment of the invention.

The reactive diluents referred to herein are multifunctional acrylate esters, termed "reactive" since they interact with the base polymers with which they are mixed to form a cross-linked network. Such esters may simply contain hydrocarbon chains in their structure, in which case they may be represented by the general formula $R-(Acr)_n$ where R is a hydrocarbon chain, having from about 2 to 20 carbon atoms; Acr is an acrylate group, the term acrylate as used herein being meant to refer, as the case may be, to both an acrylate group, as well as a methacrylate group, or other substituted acrylate; and where n is a positive whole number from about 2 to 5. However, such esters may also include polyethers in their structure, in which case they may be represented by the general formula $(RO)_m-(Acr)_n$ in which $(RO)_m$ is a polyether, for instance, polyethylene oxide, and m is positive whole number from about 1 to 5, while Acr is an acrylate, and n is a positive whole number from about 2 to 5.

While not limited thereto, reactive diluents can include such materials as hexanediol diacrylate; hexanediol-dimethacrylate; trimethylolpropane triacrylate; trimethylolpropane-trimethacrylate; pentaerythritol-tetrolacrylate; pentaerythritol-tetramethacrylate, and others.

The ratio of base polymer to the reactive diluent present may be varied within fairly broad limits; however, it has been determined that materials, including films, which have particularly desirable properties, are formed when the reactive diluent represents from about 10% to 20%, by weight, of the weight of the base polymer employed.

One of the primary advantages of the polymers of the invention is due to the fact that in many instance, no solvents are required to prepare useful articles, including cast films, therefrom. For this reason, environmental concerns are avoided, as well as the costs entailed in solvent recovery systems, and concomitant solvent losses. Whether or not a solvent is required, however, will depend upon factors such as the chemical structure of the reactive diluent, the nature of the base polymer, the latter's molecular weight, and similar factors.

With respect to molecular weight, for example, it has been found that when the base polymer has a number average molecular weight, $\overline{M}_n$, of less than about 5,000, no solvent is required since the liquid base polymer is substantially miscible with the liquid reactive diluent with which it is combined. In cases where the $\overline{M}_n$ is about 5,000 to 10,000, however, it has been found useful to add from about 5% to 50%, by weight, based on the weight of the base polymer present, of a solvent to reduce the viscosity of the mixture to an optimum range. Whether or not a solvent is required, and the amount of solvent needed is readily determined by simple experimentation. In most instances, it has been found that a range of solvent of from about 10% to 20%, by weight, based on the weight of base polymer present, will provide an appropriate viscosity, for example, for forming films. When however, the $\overline{M}_n$ values are over about 10,000, phase separation of the reactive diluent from the based polymer can occur as a consequence of the immiscibility of the relatively non-polar base polymer with the relatively polar reactive diluent. Phase separation is normally to be avoided due to the fact that it can have a detrimental effect on films or other articles produced from the components, resulting in excessive separation of the reactants, and therefore, interference with the desired cross-linking reaction.

Suitable solvents can include any aliphatic or aromatic hydrocarbon, or mixtures thereof, which are capable of dissolving the polyisobutylene, including such solvents as xylene, toluene, hexane, and the like.

In preparing cross-linked materials from the base polymers and the reactive diluents of the invention by exposure to UV radiation, a UV sensitizer, for example, 2,2-dimethoxy-2-phenyl-acetophenone, is added to the reaction mixture of the polyisobutylene base polymer and the reactive diluent, to provide ultraviolet sensitivity. The amount of sensitizer required, while depending upon the nature of the components employed in the system to be cross-linked, as well as the sensitizing characteristics of the sensitizing agent, normally will constitute about 1% to 10%, by weight, based on the weight of the base polymer employed, with about 5% producing desirable results in most instances. Incorporation of the UV sensitizer in the mixture is sometimes facilitated by dissolving the sensitizer in methylene chloride, carbon tetrachloride, or some other suitable solvent.

Following addition of the desired sensitizing agent, cross-linking can be induced by exposing the reaction mixture, preferably under a nitrogen blanket, to ultraviolet light, for example, for about 10 to 30 seconds in an ultraviolet unit such as a Portacure F 1500 unit, a trademark of American Ultraviolet Company for a UV radiation unit. Curing can also be induced, however, by exposing the reaction mixture to other high-energy radiation, for example, to electron beam radiation, in which case a sensitizing agent need not be used.

The reactions and procedures employed in the course of preparing the base polymers described in the preceding, often involve the application of heat to the reaction components at some stage in the processing. Furthermore, the components frequently exhibit reaction tendencies, even at room temperatures. In order to avoid premature cross-linking which can occur as a result thereof, it is, therefore, frequently desirable to add a stabilizer compound to the reaction components such as, for instance, 1,3,5-diphenylverdazyl. In such cases, the use of about 1%, by weight, of the stabilizer compound, based on the weight of the base polymer present, is normally adequate for the purpose.

The resulting cross-linked polymers comprise composite networks which include a soft base polymer continuous phase, interspersed with a relatively hard polyacrylate discrete phase. Water absorption of films prepared from the materials is negligible, less than 5%, and the polymers exhibit a high order of heat stability, i.e., up to about 350° C. The base polymer portion of the compositions shows a glass transition temperature, $T_g$, below about $-70°$ C., while the polyacrylate portion shows a $T_g$ of about 60° C. to 80° C., values which assure tough, flexible polymeric materials. Clear, transparent films made from the materials retain their flexibility even after contact with destructive chemicals such as concentrated sulfuric acid or concentrated caustic soda, and very surprisingly, show extremely low solvent swelling even after exposure to solvents such as heptane and benzene. The low swelling characteristics of the materials are extremely beneficial since they assure that the materials will not be detrimentally affected in applications where exposure to solvents is inevitable.

While not intended to be limiting in nature, the following examples are illustrative of the invention.

EXAMPLE 1

Approximately 5 gms of a difunctional, acrylate-capped, telechelic polyisobutylene, Acr-PIB-Acr, is dissolved in 5 mls of carbon tetrachloride and 0.5 gm of trimethylolpropane-triacrylate, TMP-TA. The $\overline{M}_n$ of the polyisobutylene base polymer is 17,000. One ml of a 20%, by weight, solution of 2,2-dimethoxy-2-phenyl-acetophenone, a UV sensitizer, in carbon tetrachloride solution is then added. The material is poured into an aluminum weighing dish and the solvent is evaporated by first storing the material in a hood at room temperature, followed by drying it in a convection oven under nitrogen at 55° C. After dissolving the aluminum container in concentrated NaOH, the resulting film is irradiated for 30 seconds with a Portacure F 1500 UV-curing unit. The film obtained is relatively clear, and exhibits a tensile strength of 4 kg/cm$^2$ and an elongation of 125%. Water absorption is essentially 0%.

EXAMPLE 2

In a further experiment, 5 gms of a difunctional Acr-PIB-Acr polymer having a $\overline{M}_n$ of 17,000 is dissolved in 5 mls of carbon tetrachloride, together with 1 gm of trimethylol-propane-trimethacrylate, TMP-TMA. One ml of a 20% solution of the photosensitizer of Example 1 in carbon tetrachloride solution is then added, and the resulting solution is poured into an aluminum dish and irradiated 30 seconds, as described in Example 1. The film obtained is heterogeneous, that is, it shows phase separation, probably due to the relatively large amount of the polar TMP-TA, as well as the relatively high $\overline{M}_n$ value. While the product could be used in some applications, it would be unsuitable for others; consequently, the film is not physically tested.

EXAMPLE 3

In another experiment, 5 gms of a methacrylate-capped telechelic polymer, MetAcr-PIB-MetAcr, with an Mn of 3,000 is combined with 0.5 gm of TMP-TMA. One ml of a 20% solution of the photosensitizer of Example 1 in carbon tetrachloride is then added, and irradiation is performed for 20 seconds in the manner previously described. A slightly yellow, transparent film is obtained which physical testing shows has a tensile strength of about 8.3 kg/cm$^2$, and an elongation of 120%. Water absorption of the material is about 5%, by weight. The Example illustrates how a useful film can be made from an essentially solventless composition.

EXAMPLE 4

In yet another example, 5 gms of MetAcr-PIB-MetAcr having a $\overline{M}_n$ of about 3,000 is combined with 1 gm of TMP-TMA, and 1 ml of a 20% solution of the photosensitizer of Example 1 in carbon tetrachloride, providing an essentially solventless composition. The mixture is deposited in an aluminum dish, dried, and exposed to 20 seconds of ultraviolet radiation, as previously described. The experiment yields a light yellow, slightly hazy, flexible film which displays a tensile strength of 25 kg/cm$^2$, and an elongation of about 50%. Water absorption is essentially nil.

EXAMPLE 5

In another experiment, 5 gms of a trifunctional, telechelic polyisobutylene methacrylate,

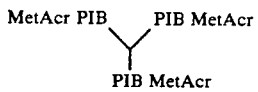

, which has a $\overline{M}_n$ of 3,300, is added to 0.5 gm of TMP-TMA. One ml of a 20%, by weight, solution of Irgacure 651, a trademark of the Aldrich Co. for the photosensitizer of Example 1, dissolved in carbon tetrachloride is added to complete the solution, which is essentially solventless, and the solution is placed in an aluminum dish and irradiated for 10 seconds, as previously described in Example 1. The polymer film obtained is light yellow in color, transparent, and physical testing shows it to have a tensile strength of 5.4 kg/cm$^2$, and an elongation of 80%. Water absorption of the film is about 5%.

EXAMPLE 6

In a still further experiment, 5 gms of a multiblock copolymer comprised of polyisobutylene mid-blocks, and end blocks of polyisoprene, and having a $\overline{M}_n$ of 9,500, and an $\overline{M}_w/\overline{M}_n$ of 1.15 is dissolved in 5 mls of carbon tetrachloride. The isoprene content of the copolymer is 23 mole %, 30% of which is cyclized, and the copolymer has been functionalized by hydroboration and oxidation, followed by esterification with acryloyl chloride to provide 16 mole % of acryloyl pendant groups. The copolymer is mixed with 0.5 gm of TMP-TA, and 1 ml of a 20% solution of Irgacure 651 in carbon tetrachloride.

A film is then prepared by pouring the solution in an aluminum dish, drying it, and then dissolving the dish in caustic soda, as previously described. The film is irradiated for 30 seconds, as set forth in Example 1, to yield a transparent, yellow film having a tensile strength of 45 kg/cm$^2$, and an elongation of 450%. The film is insoluble in tetrahydrofuran, as well as in boiling toluene, indicating a tightly crosslinked network.

While in accordance with the patent statutes, a preferred embodiment and best mode has been presented, the scope of the invention is not limited thereto, but rather is measured by the scope of the attached claims.

What is claimed is:

1. A cross-linked polymeric composition produced by cross-linking a mixture comprising a base polymer of:
   (a) a cationically polymerized telechelic polyisobutylene-containing polymer, said polymer having multiple terminal functionally reactive acrylate groups attached to said polymer or,
   (b) a cationically polymerized block copolymer which includes polyisobutylene and polydiene blocks, said copolymer carries multiple functionally reactive acrylate groups attached to said copolymer; together with a reactive diluent, which includes an acrylate ester selected from the group consisting of compounds of the general formula: R—(Acr)$_n$ and (RO$_m$—(Acr)$_n$, in which R is a hydrocarbon chain, (RO)$_m$ is a polyether, Acr is an acrylate or substituted acrylate and m and n are positive whole numbers, through exposure of said mixture to a high-energy radiation.

2. The composition according to claim 1 in which said high-energy radiation comprises ultraviolet rays and the mixture includes an ultraviolet sensitizer.

3. The composition of claim 1 that in film shape is transparent.

4. The composition according to claim 1 in which said acrylate ester is selected from the group consisting of hexanediol-diacrylate, hexanediol-dimethacrylate, trimethylolpropane-triacrylate, trimethylolpropane-trimethacrylate, pentaerythritol-tetraacrylate, and pentaerythritol-tetramethacrylate.

5. The composition according to claim 1 which said polymer is a block copolymer which contains partially cyclized polydiene blocks that carry multiple acrylate groups, in addition to said polyisobutylene block.

6. The composition according to claim 5 in which said polydiene blocks are polyisoprene blocks.

7. An essentially solvent-free composition according to claim 1, wherein the number average molecular weight of said base polymer is less than about 10,000.

8. The composition of claim 1 wherein the base polymer has a number average molecular weight $\overline{M}_n$ of less than about 5000 and is essentially free of non-reactive solvents.

* * * * *